(12) United States Patent
Kang

(10) Patent No.: US 6,333,870 B1
(45) Date of Patent: Dec. 25, 2001

(54) NONVOLATILE FERROELECTRIC MEMORY DEVICE AND METHOD FOR DRIVING SAME

(75) Inventor: Hee Bok Kang, Daejeon-si (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/708,442

(22) Filed: Nov. 9, 2000

(30) Foreign Application Priority Data

Jan. 28, 2000 (KR) .................................... 12/4303

(51) Int. Cl.[7] ...................................... G11C 11/22
(52) U.S. Cl. ............................... 365/145; 365/117
(58) Field of Search ...................... 365/145, 189.11, 365/207, 149, 117, 189.09, 203

(56) References Cited

U.S. PATENT DOCUMENTS

| | | |
|---|---|---|
| 4,873,664 | 10/1989 | Eaton, Jr. . |
| 5,621,680 * | 4/1997 | Newman et al. ............... 365/145 |
| 5,754,466 * | 5/1998 | Arase ............................ 365/145 |
| 6,198,651 * | 3/2001 | Lee et al. ...................... 365/145 |

* cited by examiner

Primary Examiner—Trong Phan
Assistant Examiner—Thong Le
(74) Attorney, Agent, or Firm—Morgan, Lewis & Bockius LLP

(57) ABSTRACT

A nonvolatile ferroelectric memory device and a method for driving the same only vary a wordline during precharge time to shorten the precharge time and thus minimize chip cycle time, thereby improving chip characteristics. The nonvolatile ferroelectric memory device is provided with a plurality of sub cell arrays consisting of a plurality of main cells and at least one reference cell, wherein the reference cell of any one of the sub cell arrays is operated along with a main cell of a neighboring sub cell array. The nonvolatile ferroelectric memory device includes a switching unit controlled by a reference wordline signal for selectively transmitting a reference voltage stored in a ferroelectric capacitor to a bitline, a level initiating unit for selectively initiating a level of an input terminal of the switching unit connected to the ferroelectric capacitor, and a plurality of ferroelectric capacitors connected to the input terminal of the switching unit in parallel. The method for driving the nonvolatile ferroelectric memory device includes activating the wordline and the plate line in an active period of one cycle, inactivating the wordline, activating a sensing amplifier, inactivating the plate line, activating the wordline when a precharge period starts, and inactivating the wordline before the precharge period ends.

24 Claims, 9 Drawing Sheets

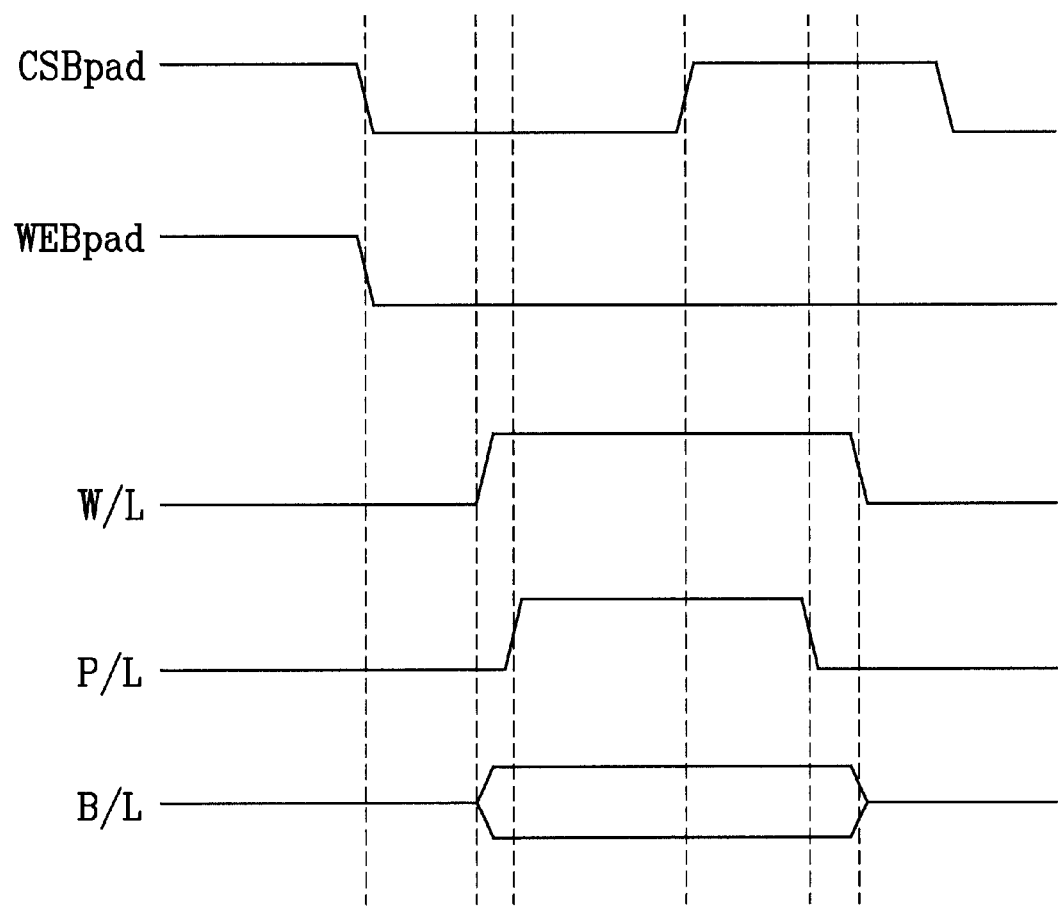

NONVOLATILE FERROELECTRIC MEMORY DEVICE AND METHOD FOR DRIVING SAME

BACKGROUND OF THE INVENTION

1. Field of the Invention

The present invention relates to a semiconductor memory device, and more particularly, to a nonvolatile ferroelectric memory device and a method for driving the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

However, the related art nonvolatile ferroelectric memory device and the method for driving the same has various disadvantages.

First, the nonvolatile ferroelectric memory cell requires chip active time and precharge time. Since the levels of the wordline and the plate line should be transited during the precharge time in the related art, the precharge time should be longer. The longer precharge time causes chip cycle time to be longer. This may deteriorate chip characteristics.

Furthermore, loading difference of bitlines is caused by the capacitance difference between the main cell and the reference cell. The loading difference cannot be solved in the related. This deteriorates sensing margin.

SUMMARY OF THE INVENTION

An object of the invention is to solve at least the above problems and/or disadvantages and to provide at least the advantages described hereinafter.

Another object of the present invention is to provide a nonvolatile ferroelectric memory device and a method for driving the same that substantially obviates one or more of the problems due to limitations and disadvantages of the related art.

Another object of the present invention is to provide a nonvolatile ferroelectric memory device and a method for driving the same that only varies a wordline during precharge time to shorten the precharge time and thus minimize chip cycle time, thereby improving chip characteristics.

Another object of the present invention is to provide a nonvolatile ferroelectric memory device and a method for driving the same that prevents loading difference of bitlines caused by the capacitance difference between a main cell and a reference cell from being generated, thereby improving sensing margin.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve at least these objects and other advantages in a whole or in part and in accordance with purposes of the present invention, as embodied and broadly described, in a nonvolatile ferroelectric memory device provided with a plurality of sub cell arrays consisting of a plurality of main cells and at least one reference cell, wherein the reference cell of any one of the sub cell arrays is operated along with a main cell of a neighboring sub cell array, the nonvolatile ferroelectric memory device includes:

a switching unit controlled by a reference wordline signal, for selectively transmitting a reference voltage stored in a ferroelectric capacitor to a bitline; a level initiating unit for selectively initiating a level of an input terminal of the switching unit connected to the ferroelectric capacitor; and a plurality of ferroelectric capacitors connected to the input terminal of the switching unit in parallel.

To further achieve the above objects in a whole or in parts, and in accordance with purposes of the present invention, there is provided a method for driving a nonvolatile ferroelectric memory device that includes a plurality of sub cell arrays consisting of a plurality of main cells and at least one reference cell, the reference cell of any one of the sub cell arrays being operated along with a main cell of a neighboring sub cell array and each cell having one transistor and one ferroelectric capacitor among a bitline, a wordline, and a plate line, the method including the steps of: activating the wordline and the plate line in an active period of one cycle; inactivating the wordline; activating a sensing amplifier; inactivating the plate line; activating the wordline when a precharge period starts; and inactivating the wordline before the precharge period ends.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein:

FIG. 3a is a timing diagram that illustrates a write mode operation of the related art nonvolatile ferroelectric memory device;

DETAILED DESCRIPTION OF PREFERRED EMBODIMENTS

Figure 4:
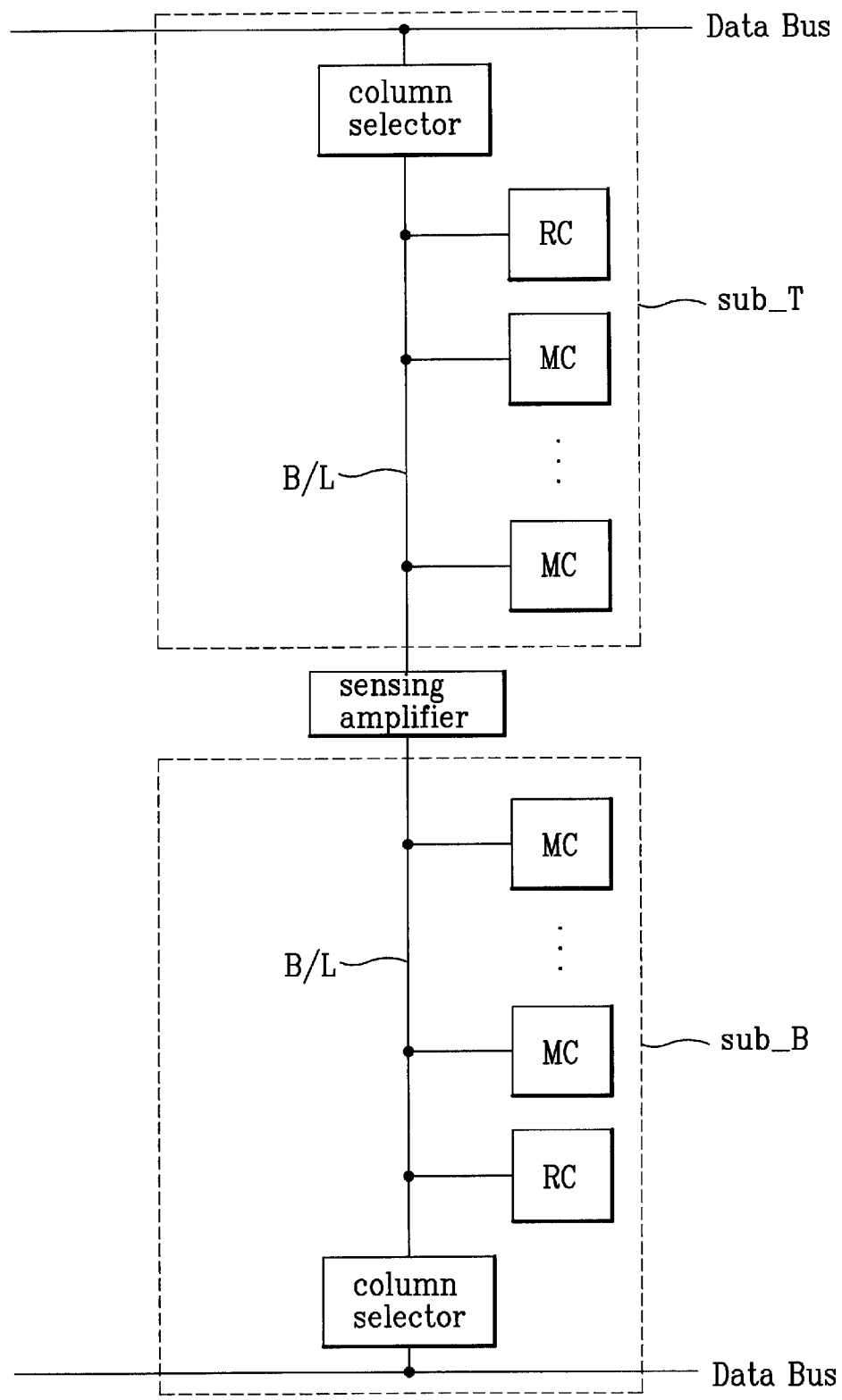
FIG. 4 is a schematic diagram that illustrates a cell array of a nonvolatile ferroelectric memory device according to the present invention.

FIG. 4 is a schematic diagram that illustrates a cell array of a nonvolatile ferroelectric memory device according to the present invention. As shown in FIG. 4, the cell array includes plurality of sub cell arrays, and a sensing amplifier S/A is provided between adjacent sub cell arrays sub_T and sub_B up and down. Each sub cell array includes a bitline B/L, a plurality of main cells MC connected with the bitline B/L, a reference cell RC connected with the bitline B/L, and a column selector CS.

At this time, the reference cell RC within the sub cell array sub_T formed over the sensing amplifier S/A is accessed to the sensing amplifier along with the main cell MC within the sub cell array sub_B formed below the sensing amplifier S/A. On the other hand, the reference cell RC within the sub cell array sub_B formed below the sensing amplifier S/A is operated at the same time along with the main cell MC within the sub cell array sub_T formed over the sensing amplifier S/A.

The column selector CS selectively activates a corresponding column bitline using Y column address. If the column selector CS is high level, the corresponding column bitline is connected with a data bus to perform data transmission.

Figure 5:
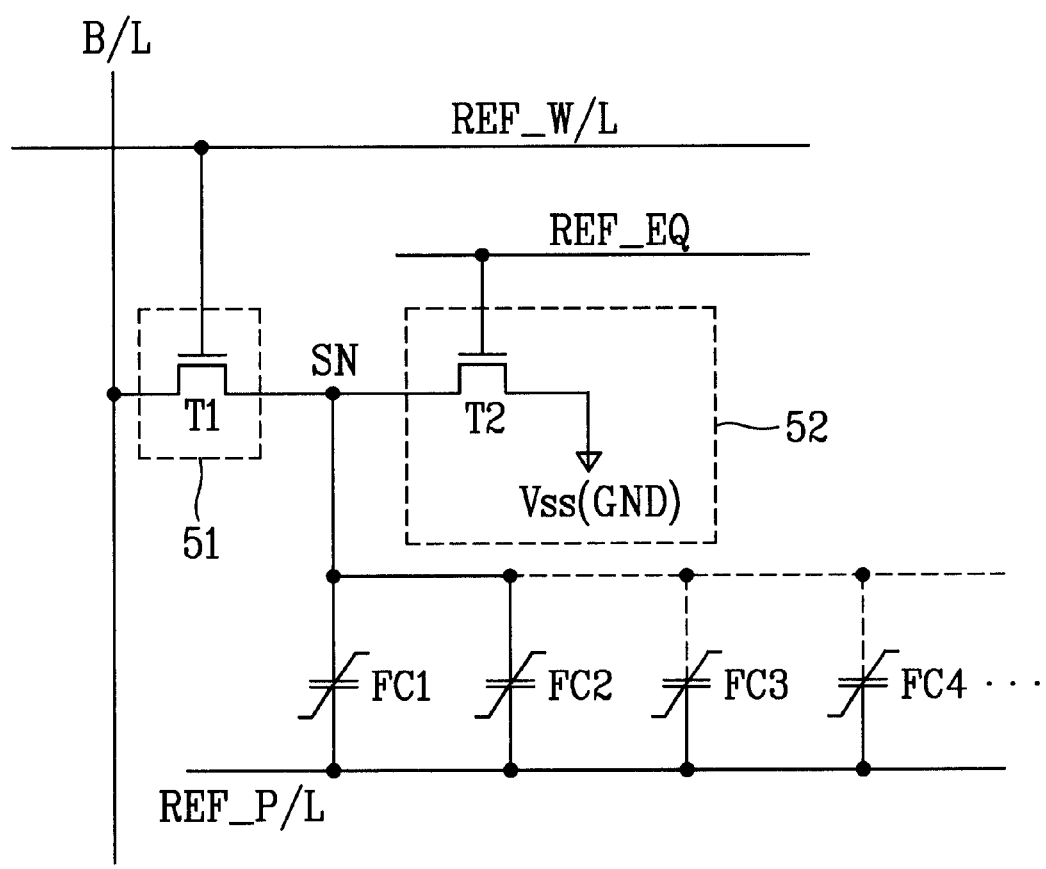
FIG. 5 is a schematic diagram that illustrates a reference cell of a nonvolatile ferroelectric memory device according to the present invention.

Each reference cell will now be described with reference to FIG. 5. As shown in FIG. 5, the reference cell includes a bitline B/L formed in one direction, a reference wordline REF_W/L formed across the bitline B/L, a switching unit 51 controlled by a signal of the reference wordline, for selectively transmitting a reference voltage stored in a ferroelectric capacitor to the bitline, a level initiating unit 52 for selectively initiating a level of an input terminal of the switching unit 51 connected to the ferroelectric capacitor, and a plurality of ferroelectric capacitors FC1, FC2, FC3, . . . , FCn connected to the input terminal of the switching unit in parallel.

The switching unit 51 includes an NMOS transistor (hereinafter, referred to as "first transistor T1") having a gate connected with the reference wordline REF_W/L, a drain connected with the bitline B/L, and a source connected with a storage node SN.

The level initiating unit 52 includes an NMOS transistor (hereinafter, referred to as "second transistor T2") controlled by a reference cell equalizer control signal REF_EQ that acts as a control signal for initiating the storage node SN and connected between the source of the first transistor T1 and a ground terminal Vss.

The ferroelectric capacitors FCl, FC2, FC3, . . . , FCn are of a first electrode, a second electrode, and a ferroelectric material formed between the first and second electrodes. The first electrode of the respective ferroelectric capacitors is connected with the source of the first transistor T1, and the second electrode is connected with the reference plate line REF_P/L.

The number of the ferroelectric capacitors FC1, FC2, FC3, . . . , FCn are determined by the capacitor size of the reference cell. That is to say, the number of the ferroelectric capacitors can freely be adjusted depending on the capacitor size of the reference cell.

The storage node SN is connected with first terminals of the ferroelectric capacitors FC1, FC2, FC3, . . . , FCn in parallel.

The reference cell equalizer control signal REF_EQ initiates the storage node SN to a ground voltage level. That is to say, if the reference cell equalizer control signal REF_EQ is high, the second transistor T2 is turned on, so that the storage node is to be the ground voltage level.

Figure 6:
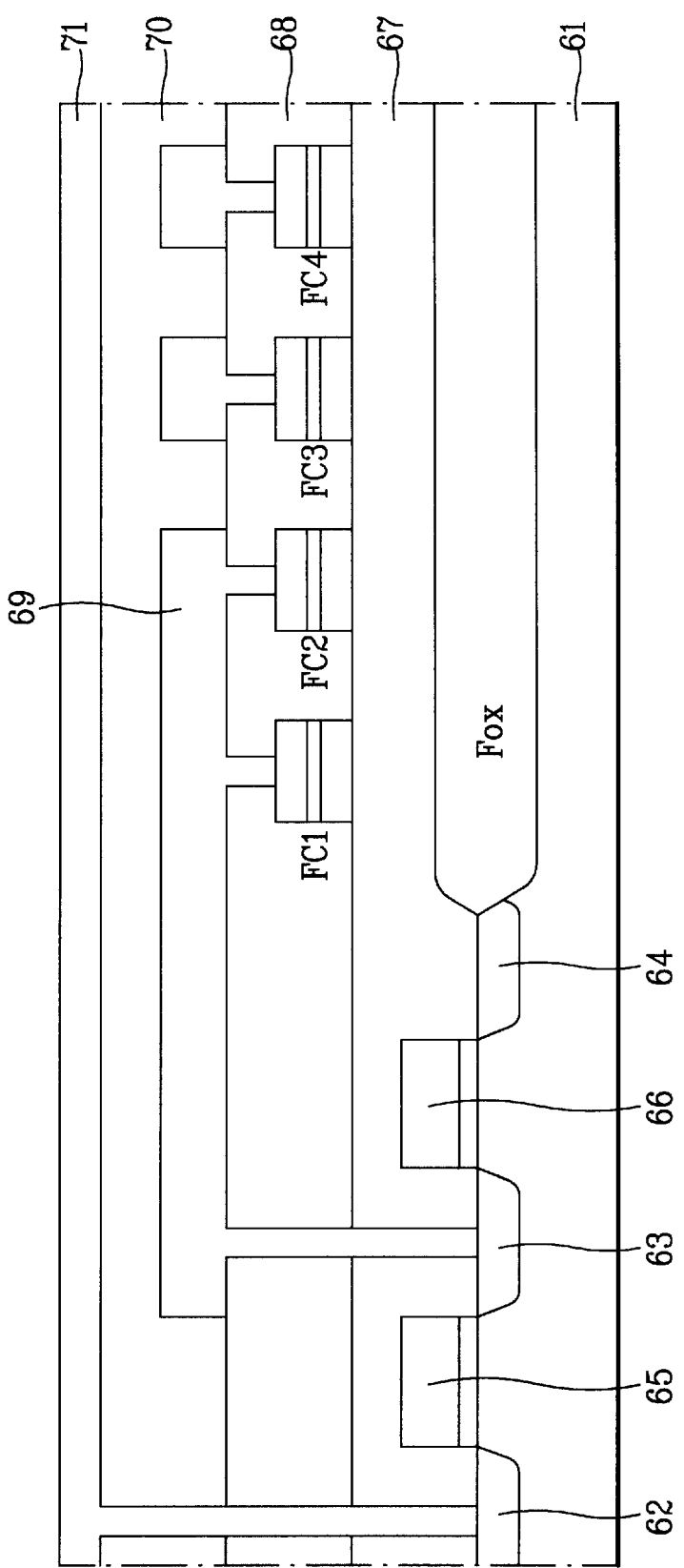
FIG. 6 is a schematic diagram that illustrates a section of FIG. 5.

Meanwhile, FIG. 6 is a sectional view of the reference cell shown in FIG. 5. As shown in FIG. 6, a first impurity region 62, a second impurity region 63, and a third impurity region 64 are selectively formed in a semiconductor substrate 61 of an active region. A gate electrode 65 of the first transistor T1 is formed on the substrate between the first impurity region 62 and the second impurity region 63. A gate electrode 66 of the second transistor T2 is formed between the second impurity region 63 and the third impurity region 64. A first insulating layer 67 is formed on an entire surface of the substrate including the gate electrodes 65 and 66. A plurality of ferroelectric capacitors FC1, FC2, FC3, . . . , FCn are formed on the first insulating layer 67. A second insulating layer 68 is formed on the entire surface of the substrate including the ferroelectric capacitors FC1, FC2, FC3, . . . , FCn. A conducting layer 69 is formed on the second insulating layer 68 to selectively connect the second impurity region 63 with the first electrodes (upper electrodes) of the ferroelectric capacitors FC1, FC2, FC3, . . . , FCn. A third insulating layer 70 is formed on the entire surface of the substrate including the conducting layer 69. A bitline 71 connected with the first impurity region 62 is formed on the third insulating layer 70.

The second electrodes (lower electrodes) of the ferroelectric capacitors FC1, FC2, FC3, . . . , FCn are connected with the reference plate line REF_P/L. The ferroelectric capacitors FC1, FC2, FC3, . . . , FCn are formed of the second electrode (lower electrode), the ferroelectric material, and the first electrode (upper electrode) in turn. The first and second electrodes are formed of Pt, Ru, or their alloy. The ferroelectric material is formed of either SBT or PZT.

Figure 7:
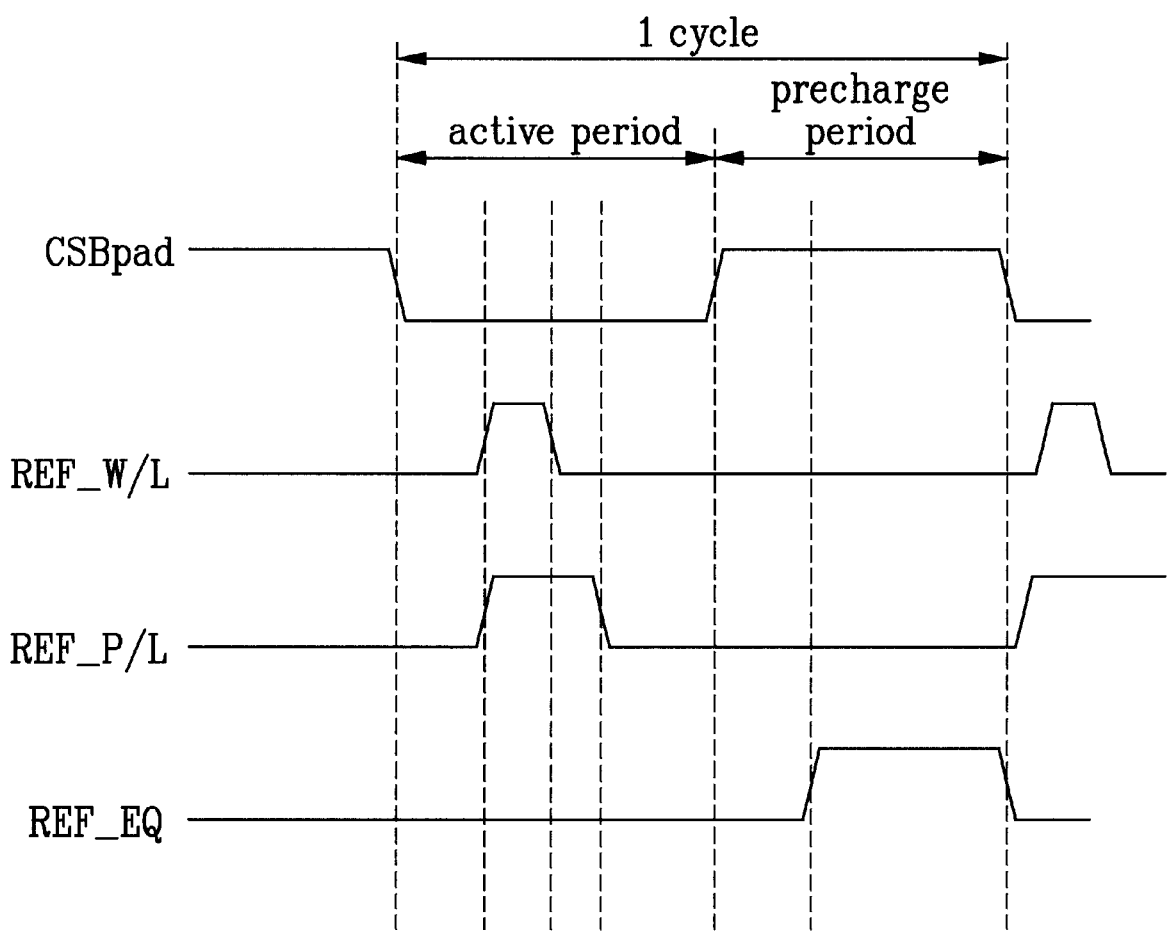
FIG. 7 is a timing diagram that illustrates an operation of a reference cell of a nonvolatile ferroelectric memory device according to the present invention.

A method for driving the aforementioned nonvolatile ferroelectric memory device will be described with reference to FIG. 7. FIG. 7 is a timing diagram that illustrates an operation of a reference cell of the nonvolatile ferroelectric memory device according to the present invention.

Figure 1:
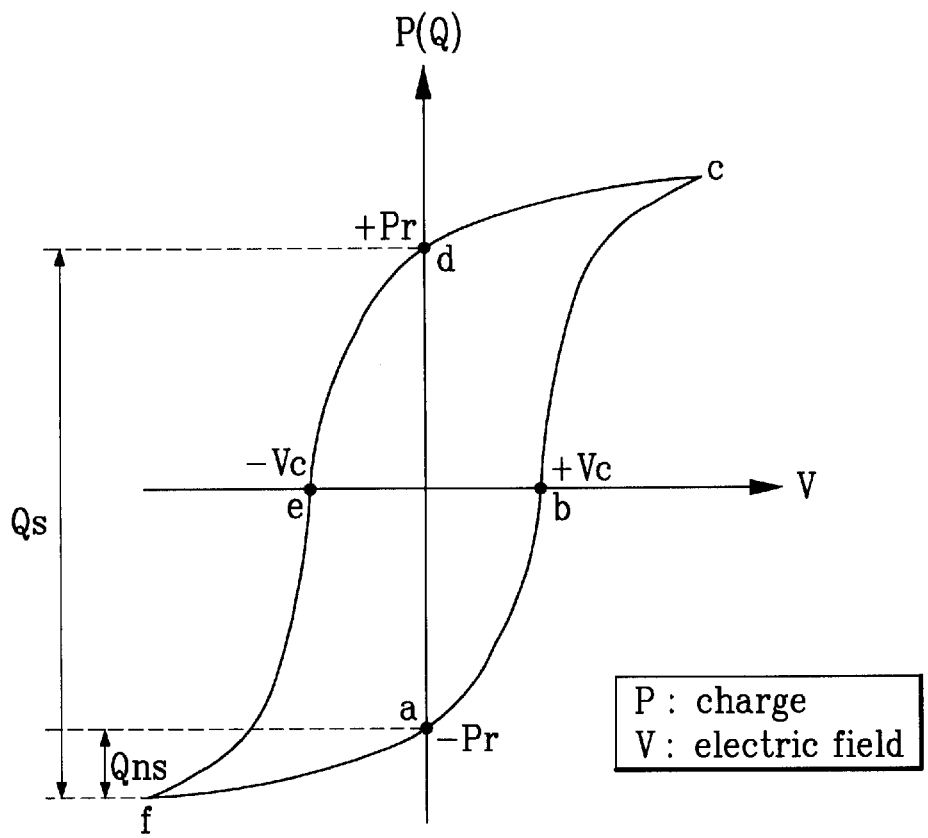
FIG. 1 illustrates a hysteresis loop of a ferroelectric material.
Figure 2:
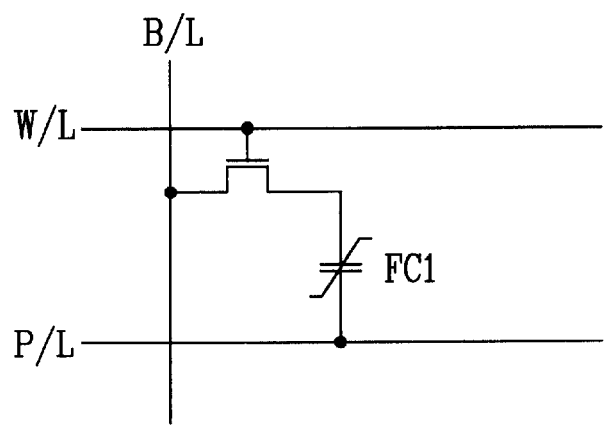
FIG. 2 is a schematic diagram that illustrates a unit cell of a related art non-volatile ferroelectric memory device.
Figure 3B:
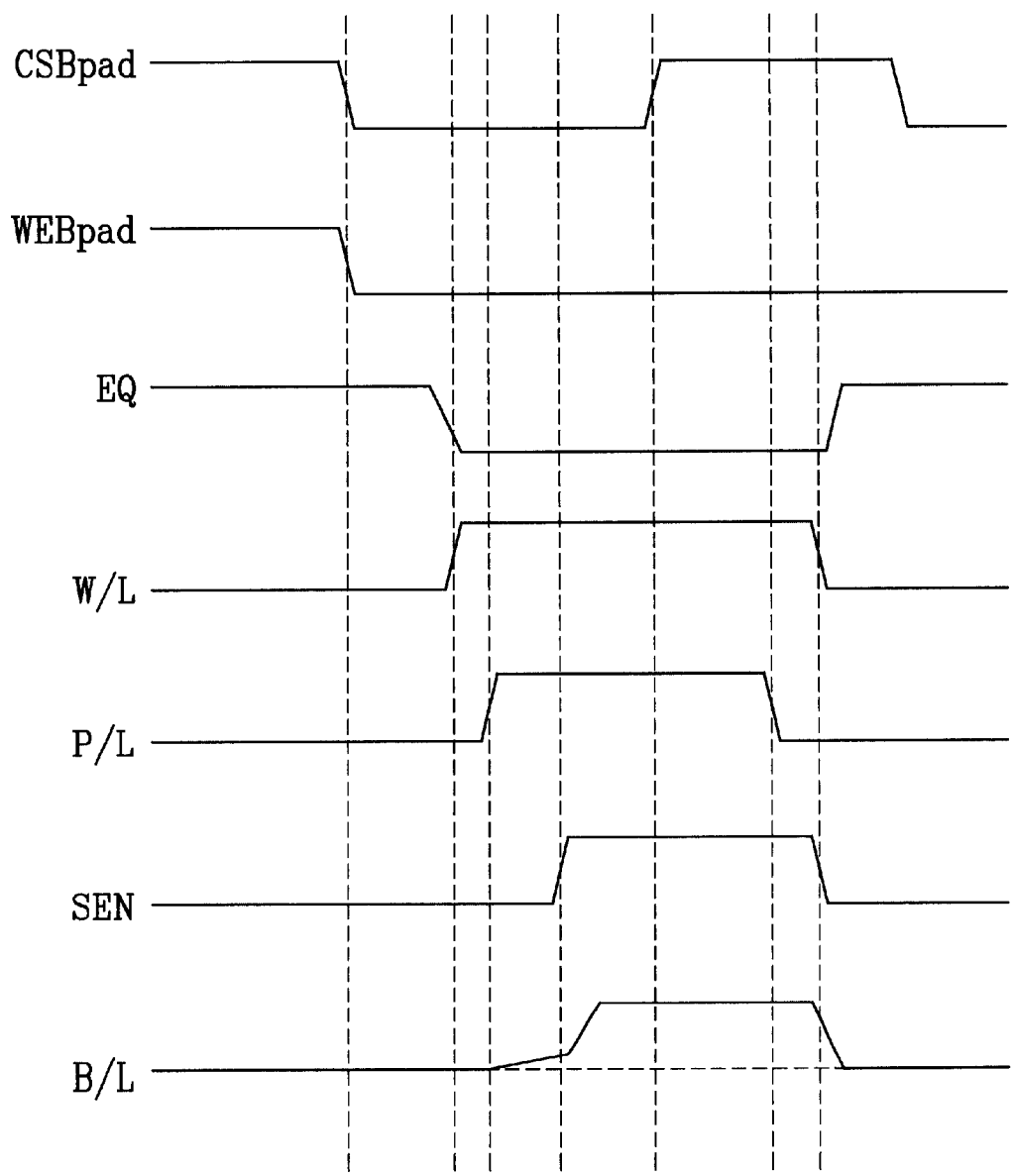
FIG. 3b is a timing diagram that illustrates a read mode operation of the related art nonvolatile ferroelectric memory device.

Qs in the hysteresis loop of FIG. 1 represents switching charge of the ferroelectric capacitor, and Qns represents non-switching charge of the ferroelectric capacitor. In the present invention, the reference cell is based on Qns.

As shown in FIG. 7, during operation cycle, the reference wordline REF_W/L and the reference plate line REF_P/L are transited to high level in a period B. Accordingly, charges equal to Qns×size of ferroelectric capacitor are supplied to the bitline B/L.

At this time, before the sensing amplifier is operating, the reference wordline REF_W/L is transited to low level so that the voltage of the bitline B/L may not act on the reference cell.

Meanwhile, the reference plate line REF_P/L is maintained at high level during a period C. When the reference wordline REF_W/L is sufficiently stabilized at low level, the reference plate line REF_P/L is transited to low level.

As described above, since non-switching charge Qns is provided in the present invention, separate restoring operation is not needed during a precharge period. Therefore, the reference wordline REF_W/L does not require high pulse any longer.

The reference level depends on an initial level of the storage node. Accordingly, to stabilize the storage node, the storage node is initiated at the ground voltage level using the reference equalizer control signal REF_EQ during a period F shown in FIG. 8 based on the second transistor T2 of FIG. 5. Thus, the initial level of the storage node is maintained at the ground level, so that the reference level can be stabilized.

Figure 8:
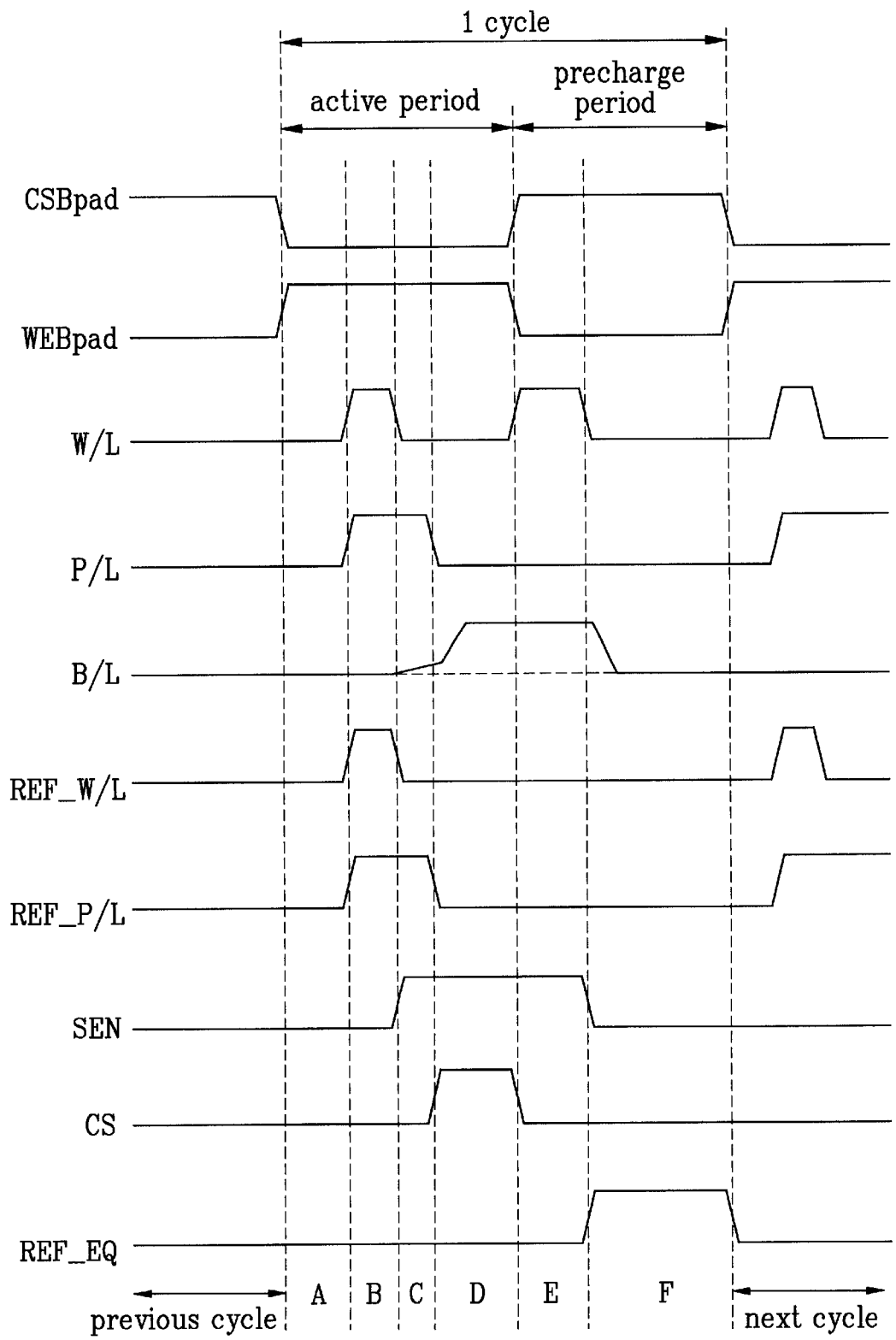
FIG. 8 is a timing diagram that illustrates a write mode operation of a nonvolatile ferroelectric memory device according to the present invention.

The method for driving the nonvolatile ferroelectric memory device will be described in more detail with reference to FIGS. 8 and 9. FIG. 8 is a timing diagram that illustrates a write mode operation of the nonvolatile ferroelectric memory device according to the present invention, and FIG. 9 is a timing diagram that illustrates a read mode operation of the nonvolatile ferroelectric memory device according to the present invention.

Figure 9:
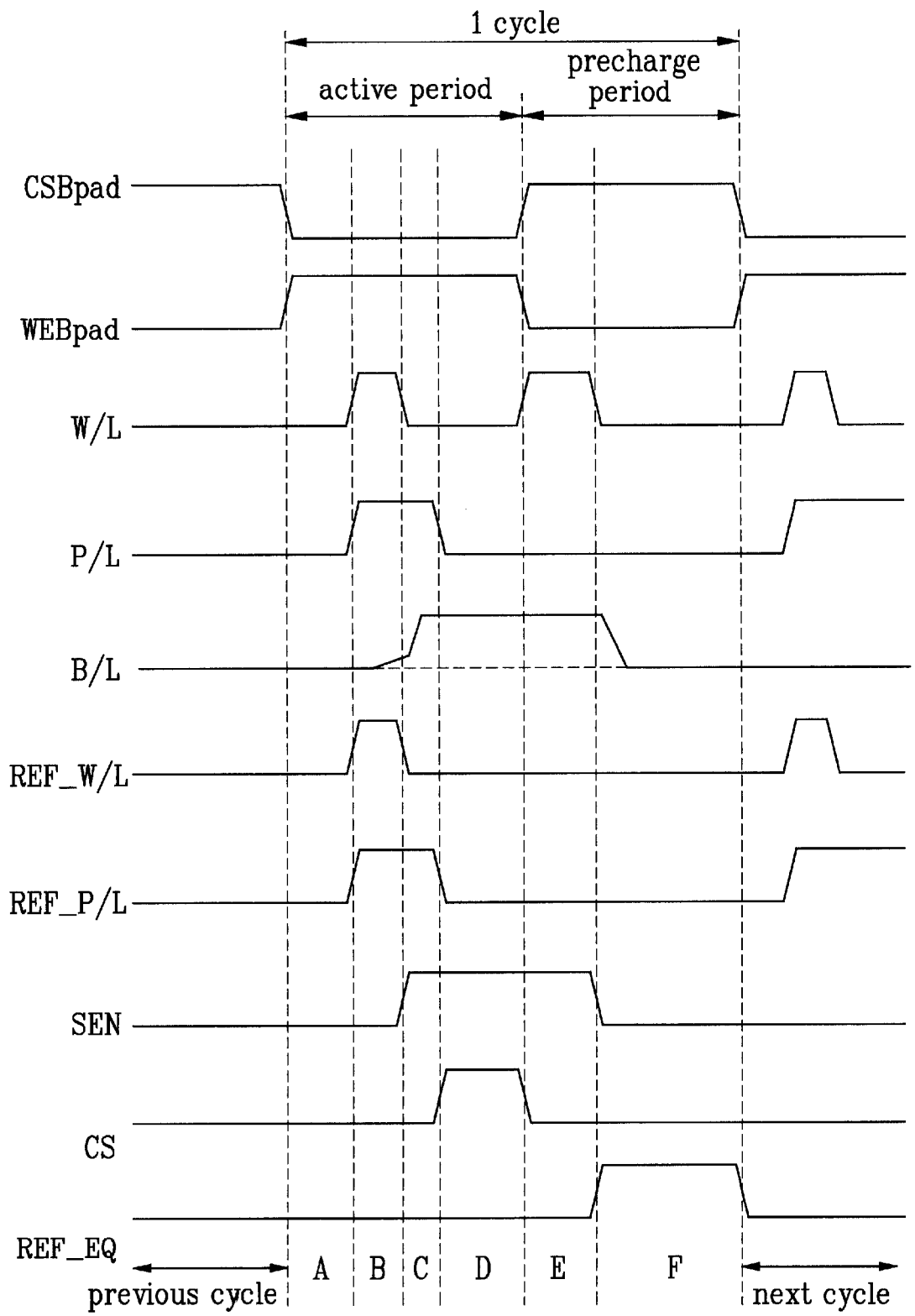
FIG. 9 is a timing diagram that illustrates a read mode operation of a nonvolatile ferroelectric memory device according to the present invention.

Referring to waveforms of FIGS. 8 and 9, it is noted that the waveforms are equal to each other during writing operation and reading operation. However, during writing operation, externally provided data are forcibly input to the bitline B/L through a data input pad by a write enable signal WEBpad. During reading operation, data amplified by the sensing amplifier are input to an external data input/output pad.

The write mode will be described with reference to the waveforms shown in FIG. 8.

One cycle is completed in such a manner that a chip enable signal CSBpad is transited to low level, and then is subject to an active period and a precharge period, sequentially.

If the active period of a chip starts, address is decoded during a period A and various control signals are activated. At the same time, corresponding wordline W/L, plate line P/L, reference wordline REF_W/L, reference plate line REF_P/L are activated at high level.

The wordline W/L represents a wordline of the main cell.

During a period B, the wordline W/L and the reference wordline REF_W/L are maintained at high level, so that data of the main cell and data of the reference cell are respectively transferred to each bitline B/L.

The bitline B/L to which the data of the main cell is transferred is different from the bitline B/L to which the data of the reference cell is transferred. In other words, as described above, the main cell within the sub cell array formed over the sensing amplifier is operated along with the reference cell within the sub cell array formed below the sensing amplifier, and the main cell within the sub cell array formed below the sensing amplifier is operated along with the reference cell within the sub cell array formed over the sensing amplifier. Accordingly, the data of the main cell is transferred to the bitline within the upper sub cell array while the data of the main cell is transferred to the bitline within the lower sub cell array.

As described above, the data of the main cell and the reference cell are transferred to each corresponding bitline. When the data of the cells are transferred to the bitline, the wordline W/L and the reference wordline REF_W/L are transited to low level to separate the bitline B/L from the cells.

Thus, bitline loading caused by the difference of the capacitor size in the main cell and the reference cell can be removed, so that sensing margin of the sensing amplifier can be improved.

As shown in FIG. 8, if the wordline W/L and the reference wordline REF_W/L are transited to low level, the sensing amplifier enable signal SEN is activated at high level in a period C, so as to amplify the data of the bitline B/L.

At this time, the plate line P/L and the reference plate line REF_P/L are maintained at high level, and are transited to low level in a period D.

Consequently, it is noted that the plate line P/L is not transited when the wordline W/L and the reference wordline REF_W/L are transited. This can remove interference noise generated when the wordline and the reference wordline REF_W/L and the plate line P/L are transited at the same time.

Afterwards, when amplification action reaches a stable mode at the sensing amplifier, the column selector CS is activated at high level during a period D so that the data of the bitline B/L is exchanged with the data of the data bus DB.

Subsequently, the read mode will be described with reference to the waveforms shown in FIG. 9.

In the write mode, the data of the data bus DB is forcibly transferred to the bitline B/L. In the read mode, the data of the bitline is transferred to the data bus.

That is to say, if the chip enable signal CSBpad is transited to high level, the precharge period starts. If the precharge period starts, only the wordline W/L is transited from low level to high level in a period E. At this time, since the sensing amplifier active signal SEN is maintained at high level, the sensing amplifier is activated. Accordingly, the bitline B/L continuously maintains amplified data or restored data.

As a result, the logic 1 data of the main cell destroyed during the period B is restored again. This is called a restoring step. If the restoring step is completed, the bitline B/L and the storage node SN of the reference cell are initiated at the ground voltage level to start the next cycle.

As aforementioned, the nonvolatile ferroelectric memory device and the method for driving the same has the following advantages.

First, it is possible to improve sensing efficiency of the sensing amplifier by reducing loading difference between the main bitline and the reference bitline caused by the capacitance difference between the main cell and the reference cell. It is also possible to improve sensing efficiency of the sensing amplifier by reducing loading difference between the main bitline and the reference bitline caused by different positions of the main cell and the reference cell based on the sensing amplifier. Furthermore, since the plate line is in advance transited to low level in the chip active period and the wordline is only operated, chip cycle delay factors generated when the wordline and the plate line are operated at the same time are removed, thereby minimizing chip cycle time. As a result, the nonvolatile ferroelectric memory device can have improved characteristics.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A nonvolatile ferroelectric memory device provided with a plurality of sub cell arrays consisting of a plurality of main cells and at least one reference cell, wherein the reference cell of any one of the sub cell arrays is operated along with a main cell of a neighboring sub cell array, the nonvolatile ferroelectric memory device comprising:

a switching unit with a single input terminal controlled by a reference wordline signal for selectively transmitting a reference voltage stored in a plurality of ferroelectric capacitors to a bitline;

a level initiating unit for selectively initiating a level of the single input terminal of the switching unit connected to the plurality of ferroelectric capacitors; and wherein the plurality of ferroelectric capacitors are directly connected to the single input terminal of the switching unit in parallel.

2. The nonvolatile ferroelectric memory device as claimed in claim 1, wherein the level initiating unit includes an NMOS transistor having a source connected with a ground voltage terminal, for transferring a ground voltage to an input terminal of the switching unit by a reference equalizer control signal.

3. The nonvolatile ferroelectric memory device as claimed in claim 1, wherein the ferroelectric capacitors include first terminals commonly connected with the input terminal of the switching unit and second terminals commonly connected with the reference plate line.

4. The nonvolatile ferroelectric memory device as claimed in claim 1, wherein the switching unit includes an NMOS transistor.

5. The nonvolatile ferroelectric memory device as claimed in claim 1, wherein the first terminals of the ferroelectric capacitors are selectively connected with the input terminal of the switching unit.

6. A nonvolatile ferroelectric memory device provided with a plurality of sub cell arrays consisting of a plurality of main cells and at least one reference cell, wherein the reference cell of any one of the sub cell arrays is operated along with a main cell of a neighboring sub cell array, the nonvolatile ferroelectric memory device comprising:

first, second and third impurity regions selectively formed in a semiconductor substrate;

a first gate electrode formed on the substrate between the first and second impurity regions;

a second gate electrode formed on the substrate between the second and third impurity regions;

a plurality of ferroelectric capacitors electrically insulated from the first and second gate electrodes;

a conducting layer for selectively connecting ferroelectric capacitors to the second impurity region; and a bitline electrically insulated from the conducting layer and electrically connected with the first impurity region.

7. The nonvolatile ferroelectric memory device as claimed in claim 6, further comprising a switching unit for selectively transferring data of the ferroelectric capacitors to the bitline by the first gate electrode, the first impurity region and the second impurity region.

8. The nonvolatile ferroelectric memory device as claimed in claim 6, further comprising a level initiating unit for initiating a level of the second impurity region to a ground voltage level by the second gate electrode, the second impurity region and the third impurity region.

9. The nonvolatile ferroelectric memory device as claimed in claim 6, wherein the ferroelectric capacitors include first electrodes, a ferroelectric material formed on the first electrodes, and second electrodes formed on the ferroelectric material, the first electrodes being commonly connected with the conducting layer and the second electrodes being commonly connected with a reference plate line.

10. The nonvolatile ferroelectric memory device as claimed in claim 9, wherein the conducting layer is selectively separated from the first electrodes of the ferroelectric capacitors if necessary.

11. She nonvolatile ferroelectric memory device as claimed in claim 6, wherein the third impurity region is maintained at the ground voltage level.

12. The nonvolatile ferroelectric memory device as claimed in claim 9, wherein the ferroelectric material is either SBT or PZT.

13. The nonvolatile ferroelectric memory device as claimed in claim 9, wherein the first and second electrodes are of Pt, Ru, or their alloy.

14. A nonvolatile ferroelectric memory device provided with a plurality of sub cell arrays consisting of a plurality of main cells and at least one reference cell, wherein the reference cell of any one of the sub cell arrays is operated along with a main cell of a neighboring sub cell array, the nonvolatile ferroelectric memory device comprising:

a first transistor having a gate connected with a reference wordline and a drain connected with a bitline;

a second transistor controlled by a reference bitline equalizer signal applied to a gate, having a drain connected with a source of the first transistor and a source connected with a ground voltage terminal; and a plurality of ferroelectric capacitors having first terminals, second terminals, and ferroelectric layers formed between the first terminals and the second terminals, the first terminals being commonly connected with the source of the first transistor, and the second terminals being commonly connected.

15. The nonvolatile ferroelectric memory device as claimed in claim 14, wherein the first and second transistors are NMOS transistors.

16. The nonvolatile ferroelectric memory device as claimed in claim 14, wherein the second transistor selectively transfers the ground voltage to the source of the first transistor.

17. A method for driving a nonvolatile ferroelectric memory device that includes a plurality of sub cell arrays consisting of a plurality of main cells and at least one reference cell, the reference cell of any one of the sub cell arrays being operated along with a main cell of a neighboring sub cell array and each cell having one transistor and one ferroelectric capacitor among a bitline, a wordline, and a plate line, the method comprising the steps of:

activating the wordline and the plate line in an active period of one cycle;

inactivating the wordline;

activating a sensing amplifier;

inactivating the plate line;

activating the wordline when a precharge period starts; and inactivating the wordline before the precharge period ends.

18. The method as claimed in claim 17, wherein the wordline is operated by a first step of maintaining a low level at the active period, a second step of transiting from the low level to a high level, a third step of transiting from the high level to the low level, and a fourth step of maintaining the low level.

19. The method as claimed in claim 18, wherein the wordline of the low level is transited to the high level when the precharge period starts after the active period ends.

20. The method as claimed in claim 17, wherein the plate line is maintained at the low level in the first step, transited to the high level in the second step, maintained at the high level in the third step, and transited to the low level in the fourth step.

21. The method as claimed in claim 20, wherein the plate line is transited to the high level along with the wordline when an active period of a next cycle starts after the precharge period subsequent to the fourth step ends.

22. The method as claimed in claim 18, wherein a reference wordline is operated in the same manner as the wordline, and a reference plate line is operated in the same manner as the plate line.

23. The method as claimed in claim 17, wherein data are forcibly loaded in the bitline while the plate line is maintained in active state after the sensing amplifier is activated.

24. The method as claimed in claim 21, wherein the sensing amplifier is inactivated when the wordline is again transited to the low level after the precharge period starts and the wordline is transited to the high level.

* * * * *